US007195945B1

(12) United States Patent
Edelstein et al.

(10) Patent No.: US 7,195,945 B1
(45) Date of Patent: Mar. 27, 2007

(54) MINIMIZING THE EFFECT OF 1/ƒ NOISE WITH A MEMS FLUX CONCENTRATOR

(75) Inventors: Alan S. Edelstein, Alexandria, VA (US); Jeffrey S. Pulskamp, Rockville, MD (US); Michael Pedersen, Ashton, MD (US)

(73) Assignee: United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 11/226,403

(22) Filed: Sep. 15, 2005

Related U.S. Application Data

(60) Provisional application No. 60/610,129, filed on Sep. 15, 2004.

(51) Int. Cl.
*H01L 21/00* (2006.01)
(52) U.S. Cl. .......................... 438/48; 438/73; 324/244
(58) Field of Classification Search .................. 438/22, 438/24, 25, 48, 51, 53, 73, 74; 324/244, 324/225, 251, 252
See application file for complete search history.

(56) References Cited

U.S. PATENT DOCUMENTS 6,501,268 B1* 12/2002 Edelstein et al. ........... 324/244
6,670,809 B1* 12/2003 Edelstein et al. ........... 324/244

* cited by examiner

*Primary Examiner*—Hsien-Ming Lee
(74) *Attorney, Agent, or Firm*—Edward L. Stolarun; William W. Randolph

(57) ABSTRACT

A method of fabricating a MEMS device includes forming a magnetic sensor over a SOI wafer which may include an epoxy layer; forming a pair of MEMS flux concentrators sandwiching the magnetic sensor; connecting an electrostatic comb drive to each of the flux concentrators; connecting a spring to the flux concentrators and the comb drive; performing a plurality of DRIE processes on the SOI wafer; and releasing the flux concentrators, the comb drive, and the spring from the SOI wafer. Another embodiment includes forming adhesive bumps and a magnetic sensor on a first wafer; forming a second wafer; forming a pair of MEMS flux concentrators, a pair of electrostatic comb drives, and at least one spring on the second wafer; bonding the second wafer to the adhesive bumps; and compressing the adhesive bumps using non-thermal means such as pressure only.

25 Claims, 8 Drawing Sheets

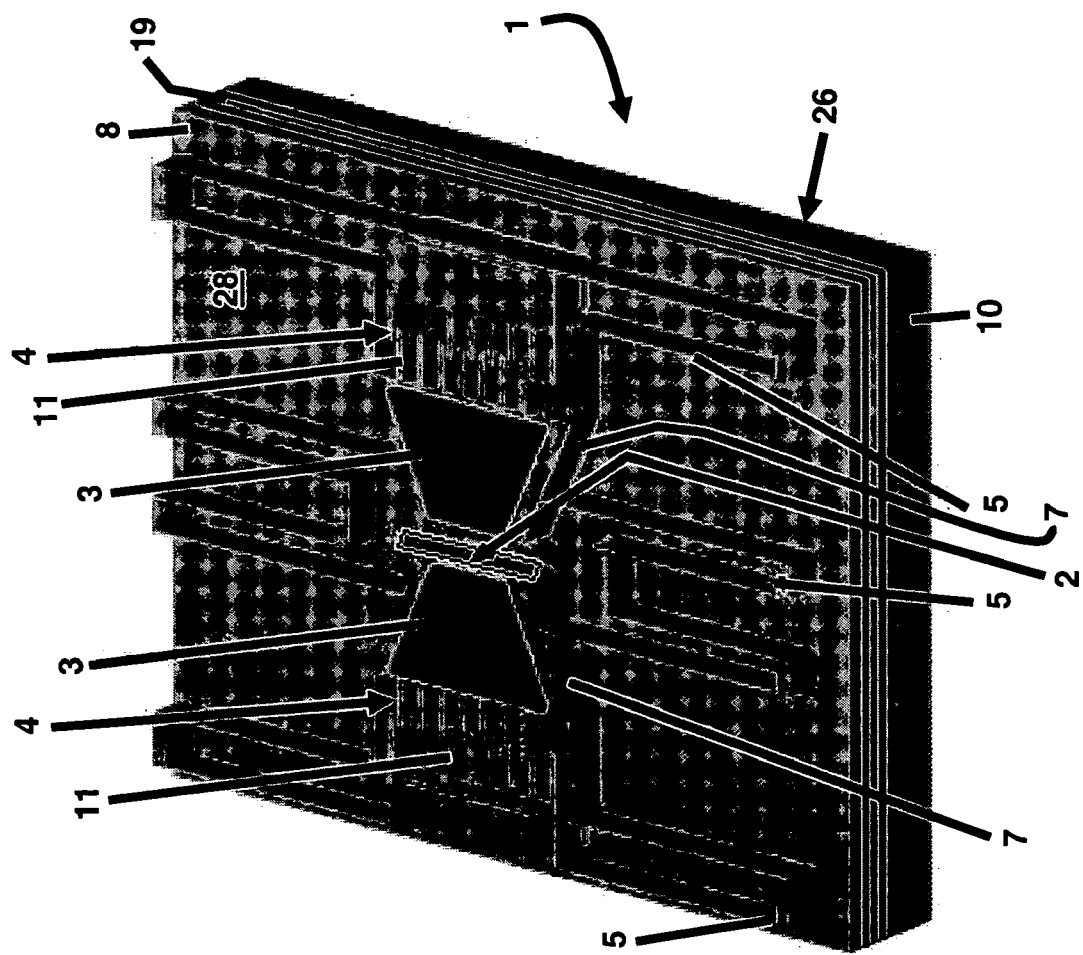

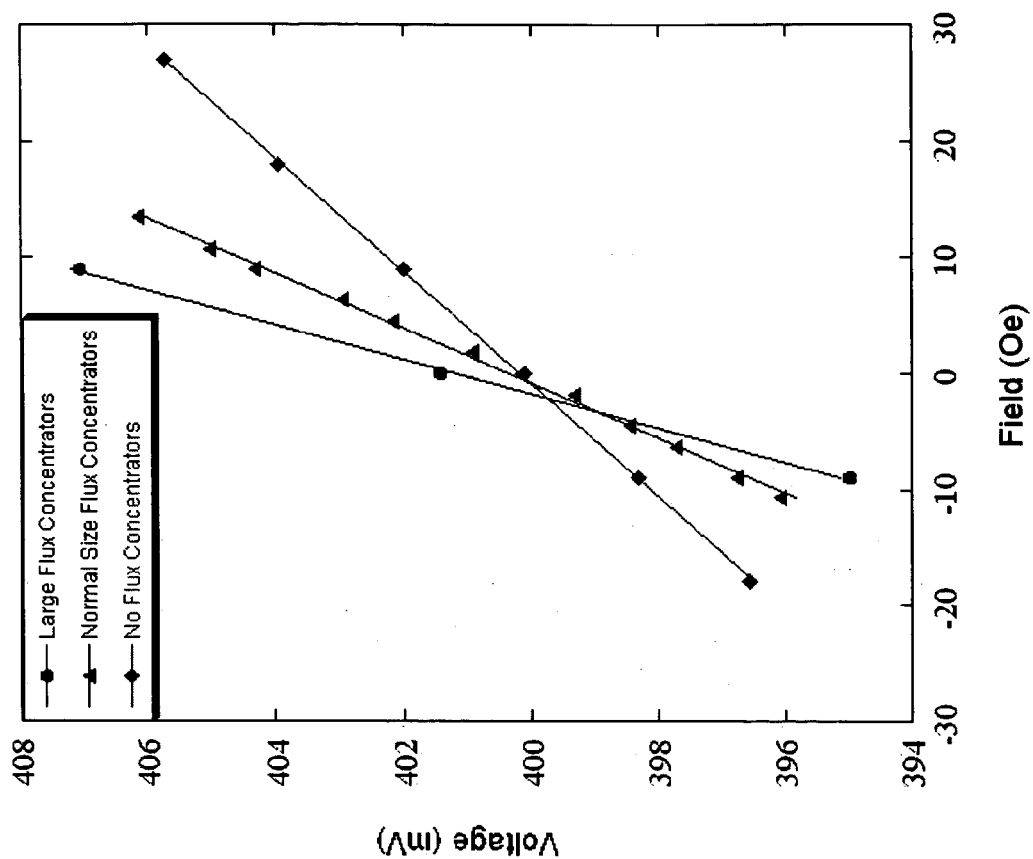
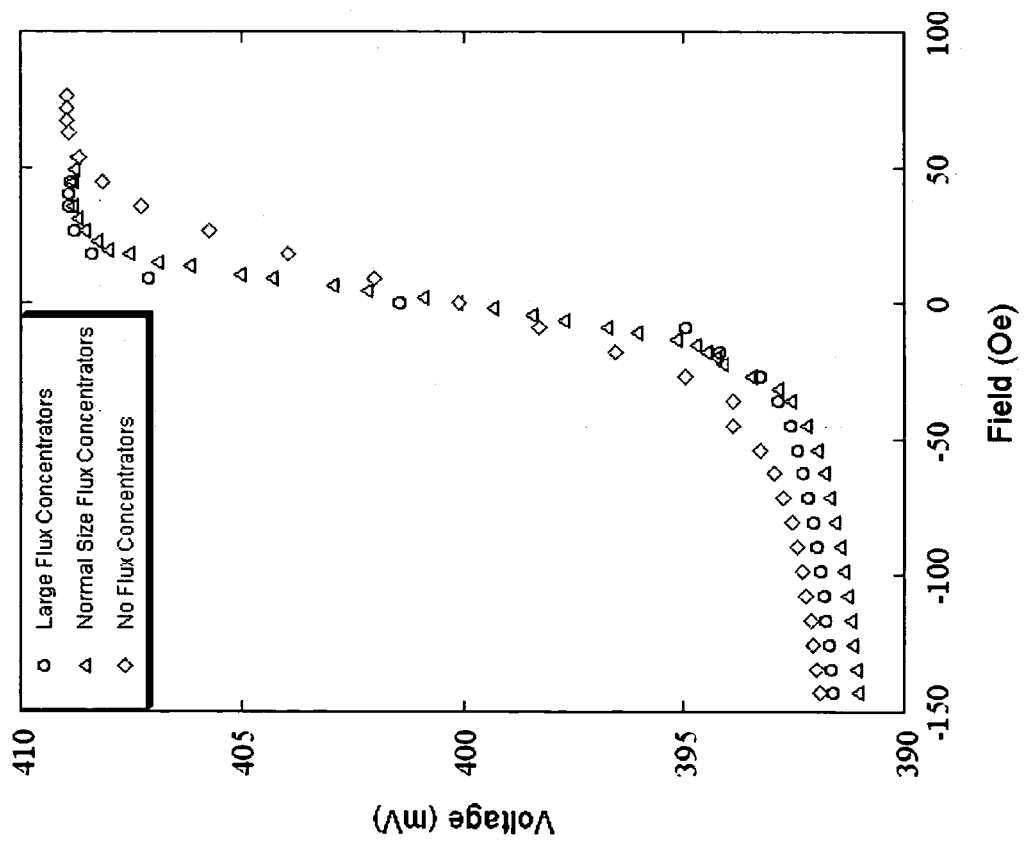
FIG. 5(B)
FIG. 5(A)

MINIMIZING THE EFFECT OF 1/f NOISE WITH A MEMS FLUX CONCENTRATOR

CROSS-REFERENCE TO RELATED APPLICATION

This application claims the benefit of U.S. Provisional Patent Application No. 60/610,129 filed Sep. 15, 2004, the complete disclosure of which, in its entirety, is herein incorporated by reference.

GOVERNMENT INTEREST

The embodiments of the invention described herein may be manufactured, used, and/or licensed by or for the United States Government.

BACKGROUND

1. Field of the Invention

The embodiments of the invention generally relate to microelectromechanical systems (MEMS), and, more particularly, to systems and methods for minimizing the effects of 1/f noise in electromechanical systems.

2. Description of the Related Art

Low frequency or 1/f noise is found in such diverse places as electronic devices, emissions of quasars, highway traffic, the global temperature, and the flow of some rivers. Thus, it is not surprising that 1/f noise is also found in magnetic materials and that it is a significant problem in magnetic sensors. The 1/f noise in magnetic sensors can be either electronic or magnetic. In addition, magnetic sensors also can have Johnson, shot, and magnetic white noise. Moreover, white-noise magnetization fluctuations in magnetoresistive heads tend to be a fundamental limit on their signal-to-noise ratio.

There has been a focus on magnetoresistive sensor technology because it shows a lot of promise for producing low cost magnetic sensors. Magnetic sensors are generally passive sensors with desirable attributes for several types of applications that include insensitivity to weather conditions, the requirement of only a small bandwidth, and the unique ability to "see through" walls and foliage without attenuation. Furthermore, in military applications it is generally difficult to make a weapon or vehicle that does not include ferrous material that can be detected by magnetic sensors. Though the permanent magnetic moment of the ferrous material can be minimized by "deperming", which is a process of reduction of permanent magnetism, the distortion of the earth's magnetic field due to the magnetic permeability is typically difficult to hide. Data from magnetic sensors can be fused with the data from other sensor modalities such as acoustic and seismic sensors to characterize or identify and track targets. Specifically, in military applications magnetic sensors can be used for perimeter defense, at check points, as part of a suite of sensors in unattended ground sensor networks, and on unmanned ground vehicles (UGVs) and unmanned air vehicles (UAVs). Moreover, magnetic sensors can also be employed to monitor rooms and passageways that have been cleared by military personnel.

The magnetic signals from military targets come from the internal motion of ferromagnetic parts and the motion of targets relative to the magnetic sensor. The latter can arise either from the motion of the target or the sensor. Both of these magnetic signals occur at low frequencies, typically less than 100 Hz. Because the earth's field is usually larger than the field generated by the target, it is generally difficult to detect the magnetic signals that occur at low frequencies, typically less than 100 Hz. Because the earth's magnetic field is usually larger than the field generated by a target, it is generally difficult to detect the magnetic target without having the field change by relative motion between the target and the sensor. At low frequencies the electric and magnetic fields are decoupled. The magnetic strength from a target at a distance greater than the target size is usually like that of a magnet dipole. Because of the relatively short detection range of magnetic sensors, a large number of magnetic sensors may have to be used if one wants to guarantee detection over a large area.

Magnetoresistance sensors are candidate low cost sensors because they can be mass produced by batch processing on silicon wafers and the drive and read out electronics are relatively simple. The resistance of a magnetoresistance sensor is sensitive to the magnitude and direction of the magnetic field. The types of magnetoresistive sensors include anisotropic magnetoresistance (AMR) sensors, giant magnetoresistance (GMR) sensors, spin dependent tunneling (SDT) sensors, magnetic tunneling junction (MTJ) sensors, and extraordinary magnetoresistance (EMR) sensors. Magnetoresistance values as large as 220% may be observed in CoFe(100)/MgO(100)/CoFe(100) MTJ sensors at room temperature. These large values may be the result of the properties of the wave function in both electrodes and in the MgO barrier.

To detect the relative motion between the target and the magnetic sensor generally requires high sensitivity in the frequency range f<1 Hz. Unfortunately, most magnetoresistance sensors tend to suffer from 1/f noise. Furthermore, there is generally a tendency for the sensors that have a larger response to magnetic fields to also have more 1/f noise. Thus, 1/f noise is a significant problem in applying magnetic sensors to military applications.

Another problem in using magnetoresistive sensors at low frequencies and at low fields is that the induced percentage in the resistance is generally small. Thus, with a single device one must accurately measure a small change in a large signal. Because of this problem, most magnetoresistive sensors have several sensors that are arranged in bridge circuits to eliminate the DC bias offset.

Anisotropic magnetoresistance sensors are probably the most sensitive, commercial, magnetoresistance sensors to use at frequencies of 1 Hz or less. This is true despite the fact that their magnetoresistance, approximately 5%, is relatively small. The reason for this is that AMR sensors have less 1/f noise than other sensors. Accordingly, there remains a need for a device that can eliminate the problem of 1/f noise in small magnetic sensors.

SUMMARY

In view of the foregoing, an embodiment of the invention provides a method of fabricating a MEMS device, wherein the method comprises forming a magnetic sensor over a silicon on insulator (SOI) wafer, wherein the SOI wafer comprises an epoxy layer; forming a pair of MEMS flux concentrators sandwiching the magnetic sensor; connecting an electrostatic comb drive to each of the MEMS flux concentrators; connecting at least one spring to the pair of MEMS flux concentrators and the electrostatic comb drive; performing a plurality of deep reactive ion etching (DRIE) processes on the SOI wafer; and releasing the MEMS flux concentrators, the electrostatic comb drive, and the at least one spring from the SOI wafer. Preferably, the magnetic sensor is formed by providing an antiferromagnetic layer;

positioning a first ferromagnetic layer over the antiferromagnetic layer; positioning a conducting layer over the first ferromagnetic layer; and positioning a second ferromagnetic layer over the conducting layer.

Preferably, the plurality of DRIE processes comprise performing a DRIE process on the device layer of the SOI wafer to define the MEMS flux concentrators, the electrostatic comb drives, and the at least one spring. Moreover, the MEMS flux concentrators preferably comprise a layer of silicon dioxide thereunder, wherein the plurality of DRIE processes may comprise performing a DRIE process on a handle layer of the SOI wafer to remove the layer of silicon dioxide from beneath the MEMS flux concentrator. Additionally, the releasing of the MEMS flux concentrators, the electrostatic comb drive, and the at least one spring from the SOI wafer may be performed using oxygen plasma. Furthermore, the MEMS flux concentrators preferably comprise a double layer of Cr and permalloy.

Another aspect of the invention provides a method of fabricating a MEMS device, wherein the method comprises forming a magnetic sensor over a SOI wafer, wherein the SOI wafer comprises a device layer over an intermediate layer over a handle layer; forming a pair of MEMS flux concentrators sandwiching the magnetic sensor; connecting an electrostatic comb drive to each of the MEMS flux concentrators; connecting at least one spring to the pair of MEMS flux concentrators and the electrostatic comb drive; performing a plurality of DRIE processes on the SOI wafer; and releasing the MEMS flux concentrators, the electrostatic comb drive, and the at least one spring from the SOI wafer. The magnetic sensor may be formed by providing an antiferromagnetic layer; positioning a first ferromagnetic layer over the antiferromagnetic layer; positioning a conducting layer over the first ferromagnetic layer; and positioning a second ferromagnetic layer over the conducting layer.

Moreover, the plurality of DRIE processes may comprise performing a DRIE process on the device layer of the SOI wafer to define the MEMS flux concentrators, the electrostatic comb drives, and the at least one spring. Furthermore, the MEMS flux concentrator preferably comprises a layer of silicon dioxide thereunder, wherein the plurality of DRIE processes may comprise performing a DRIE process on the handle layer of the SOI wafer to remove the layer of silicon dioxide from beneath the MEMS flux concentrator. Additionally, the releasing of the MEMS flux concentrators, the electrostatic comb drive, and the at least one spring from the SOI wafer may be performed using oxygen plasma. The intermediate layer may comprise an epoxy layer. Also, the MEMS flux concentrators may comprise a double layer of Cr and permalloy.

Another embodiment of the invention provides a method of fabricating a MEMS device, wherein the method comprises forming a first wafer; forming adhesive bumps on the first wafer; forming a magnetic sensor on the first wafer; forming a second wafer; forming a pair of MEMS flux concentrators, a pair of electrostatic comb drives, and at least one spring on the second wafer, wherein the pair of MEMS flux concentrators, the pair of electrostatic comb drives, and the at least one spring are connected to one another, and wherein the pair of MEMS flux concentrators sandwich the magnetic sensor. The method further includes bonding the second wafer to the adhesive bumps; and compressing the adhesive bumps using non-thermal means.

Preferably, the adhesive bumps comprise indium. Additionally, the non-thermal means preferably comprises pressure. Preferably, the magnetic sensor is formed by providing an antiferromagnetic layer; positioning a first ferromagnetic layer over the antiferromagnetic layer; positioning a conducting layer over the first ferromagnetic layer; and positioning a second ferromagnetic layer over the conducting layer. Furthermore, the first wafer preferably comprises a SOI wafer and the second wafer preferably comprises $Si_3N_4$. Also, the MEMS flux concentrators may comprise a double layer of Cr and permalloy.

A very difficult task of fabricating the device is provided according to the embodiments of the invention by combining two very different technologies, MEMS fabrication technology and magnetic sensor technology. The resulting device may increase the sensitivity of small, low cost, magnetic sensors by one to three orders of magnitude. The device can be fabricated on wafers by low cost, mass production techniques. Moreover, powering the motion of the MEMS flaps only requires microwatts of energy.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 1(B) illustrates a schematic diagram of a MEMS structure according to a second embodiment of the invention;

FIG. 5(A) is a graphical representation illustrating the magnetoresistance of a spin valve with and without flux concentrators according to an embodiment of the invention;

FIG. 5(B) is a graphical representation illustrating an enlarged view of FIG. 5(A) of the data near a zero applied field according to an embodiment of the invention;

DETAILED DESCRIPTION OF PREFERRED EMBODIMENTS

Figure 1A:
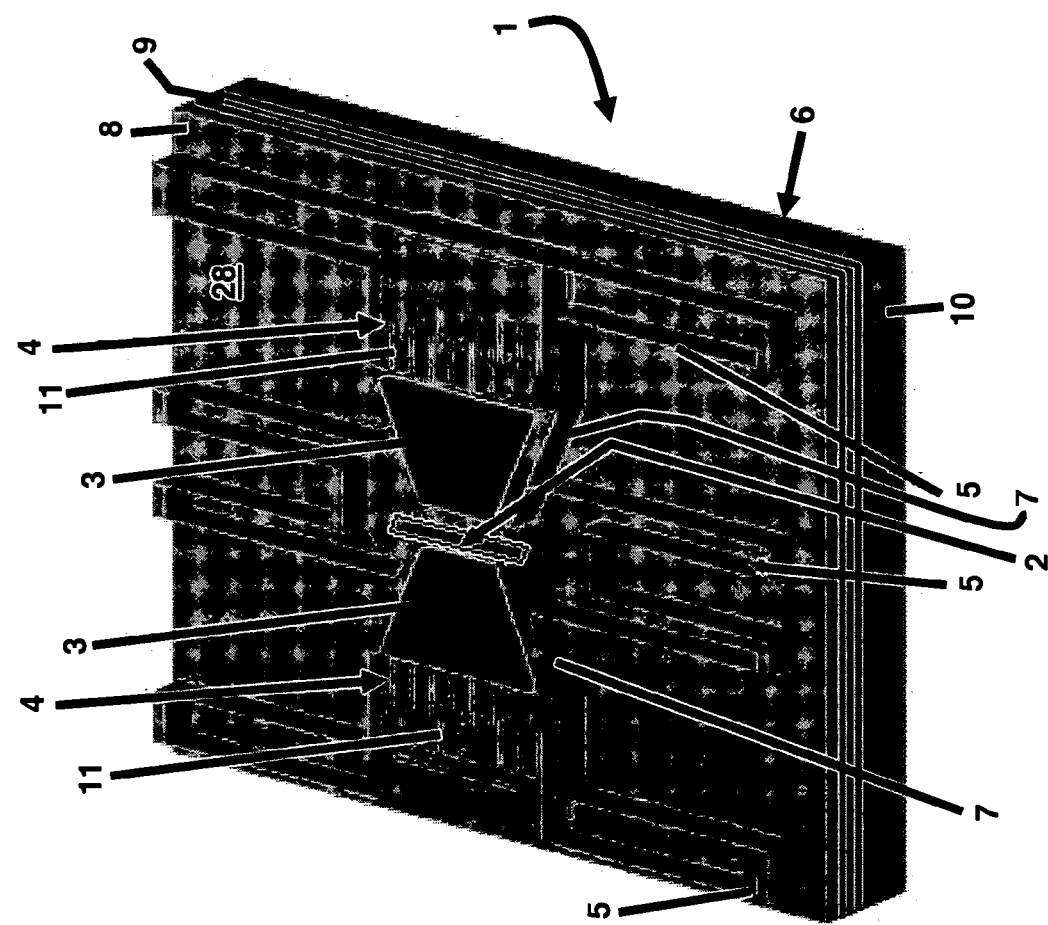
FIG. 1(A) illustrates a schematic diagram of a MEMS structure according to a first embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a device that can eliminate the problem of 1/f noise in small magnetic sensors. The embodiments of the invention achieve this by providing a modified MEMS flux concentrator to mitigate the effects of 1/f noise in magnetic sensors. Referring now to the drawings, and more particularly to FIGS. 1(A) through 8, where similar reference characters denote corresponding features consistently throughout the figures, there are shown preferred embodiments of the invention.

As illustrated in FIG. 1(A), the embodiments of the invention provide a MEMS device 1 comprising a pair of MEMS flux concentrators 3 positioned on opposite sides of a magnetic sensor 2. The flux concentrators 3 are used to enhance the magnetic field at the position of the magnetic sensor 2 by a factor ranging from 1.5 to as much as a 100. Preferably, the flux concentrators 3 are comprised of soft magnetic materials such as permalloy. According to the embodiments of the invention, the flux concentrators 3 are deposited on MEMS flaps 7, and a silicon on insulator (SOI) wafer 6 is used as the substrate. Preferably, the SOI wafer 6 is used in lieu of a plain silicon wafer because fewer processing steps are required and the SOI wafer 6 provides a flat surface 28 for fabricating the magnetic sensor 2. The SOI wafer 6 comprises a thin upper device layer 8 of silicon separated from a thick layer (also referred to as the handle layer) 10 of silicon by an approximately 1 to 5 micron silicon dioxide ($SiO_2$) layer 9.

The MEMS flaps 7 are driven to oscillate at frequencies on the order of 10 kHz by electrostatic comb drives 4. The electrostatic comb drives 4 have the advantage that they provide sufficient force to drive the flux concentrators 3 and springs 5 and that, unless the amplitude of the motion is too large, the force is independent of displacement. The flaps 7 on each side of the magnetic sensor 2 are connected by the springs 5 so that the flaps 7 have a common normal mode frequency. This is a preferred feature of the embodiments of the invention because if the motion of the two flaps 7 were not coupled, the relative phase between the motion of the flaps 7 would tend to drift. When the flux concentrators 3 oscillate, they modulate the field at the position of the magnetic sensor 2. This shifts the operating frequency of the MEMS device 1 from the high 1/f noise region at low frequencies to higher frequencies where the sensor noise is orders of magnitude lower. Moreover, the thickness of the springs 5 and separation of the teeth 11 in each of the comb drives 4 is approximately 2 μm.

During fabrication, the flux concentrators 3, comb drives 4, and springs 5 may be released from the SOI wafer 6 by dipping the MEMS device 1 into hydrofluoric (HF) acid. The HF acid removes portions of the insulating $SiO_2$ layer 9. Alternatively, one could use an alternate wafer 26 in which the $SiO_2$ layer 9 of the SOI wafer 6 (of FIG. 1(A)) is replaced by an approximate 20 μm thick epoxy layer 19 as shown in FIG. 1(B). For example, the type of epoxy material that may be used is described in U.S. Pat. No. 6,617,657, the complete disclosure of which, in its entirety, is herein incorporated by reference. Except for the fact that the $SiO_2$ layer 9 is replaced by the epoxy layer 19, the properties of this alternate wafer 26 are very similar to the SOI wafer 6 of the first embodiment. This alternative approach has the advantage that the epoxy layer 19 can be removed during the release step by exposing the MEMS device 1 to an oxygen plasma environment. This eliminates the problem of possible damage to the magnetic sensor 2 caused by the HF during the release step.

It is preferable that the magnetic sensor 2 is responsible for most of the 1/f noise and not some other part of the sensor system. This feature of the embodiments of the invention greatly reduces the 1/f noise of the magnetic sensor 2. However, it does not contribute to the reduction of the 1/f noise of the flux concentrators 3. Thus, it is preferable that the 1/f noise of the flux concentrators 3 be much less than the 1/f noise of the magnetic sensor 2. This constraint was experimentally verified. Experimentally, the noise power spectrum was measured on spin valves 2, which is a type of GMR sensor, both with and without flux concentrators 3. The measurements were repeated with different currents passing through the spin valves.

Figure 2:
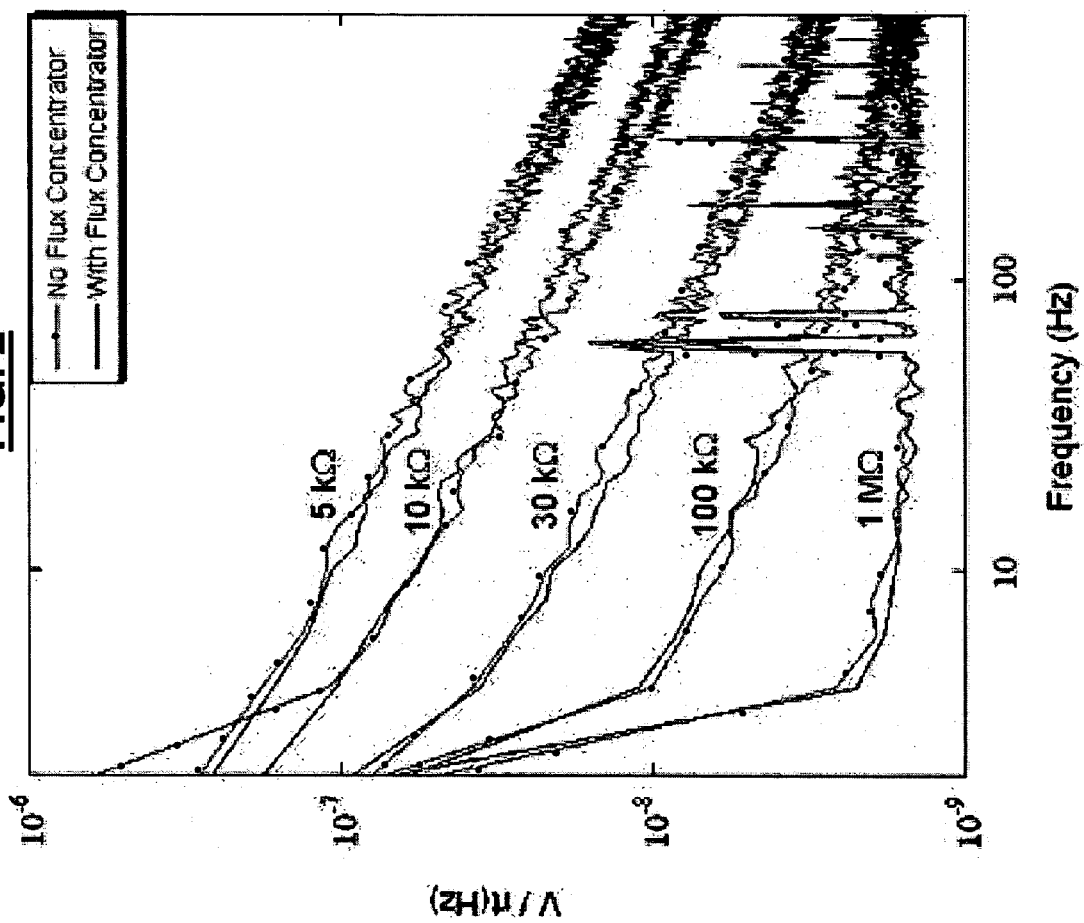
FIG. 2 is a graphical representation illustrating the noise voltage of spin valves with and without flux concentrators according to an embodiment of the invention.

The results of these measurements are shown in FIG. 2. The curves are labeled by the value of the resistor in series with the spin valve 2 that limited the current, I, through the spin valve 2. The resistance of the spin valve 2 is approximately 400 ohms. The noise is much higher for lower values of resistance because the 1/f noise is expected to increase as $I^2$. Of more significance, the noise power spectra is indistinguishable for different currents passing through the spin valves 2 with and without the flux concentrators 3. This result implies that 1/f noise of the flux concentrator 3 is much less than the 1/f noise of the spin valve 2. The likely explanation for the result that 1/f noise of the flux concentrator 3 is much less than the 1/f noise of the spin valve 2 is that the flux concentrator 3 is structurally much larger than the spin valve 2. Preferably, the flux concentrator 3 is approximately 1,500 times larger than the spin valve 2.

Furthermore, it is expected that the 1/f noise power is proportional to 1/N where N is the number of atoms in the system. Generally, it is not practical to put a useful experimental bound on the noise from the flux concentrator 3 using this data. Rather, it is easier to estimate the noise in the flux concentrators 3 once the noise in the magnetic sensor 2 is minimized through the operation of the flux concentrators 3, comb drives 4, and springs 5. Nevertheless, this experiment provides strong support of the concept of using the MEMS flux concentrators 3 to minimize 1/f noise of the magnetic sensor 2.

With respect to FIGS. 1(A) and 1(B), during operation of the MEMS device 1, a constant current is sent through the spin valve magnetic sensor 2 and the resulting voltage is sent to the signal processing electronics (not shown). This signal is modulated by the motion of the flux concentrators 3, comb drives 4, and springs 5. A voltage at a frequency $f_0$ is applied to drive the motion of the flux concentrators 3, comb drives 4, and springs 5. This voltage, independent of its sign, creates a force that tends to increase the overlap of the teeth 11 of the comb drives 4. Because the force is independent of the sign of the applied voltage, the MEMS motion occurs at a frequency $2f_0$. Thus, the signal is insensitive to pickup at the drive frequency $f_0$. The voltage across the spin valve 2 is amplified by a broadband amplifier (not shown) and demodulated.

Figure 3:
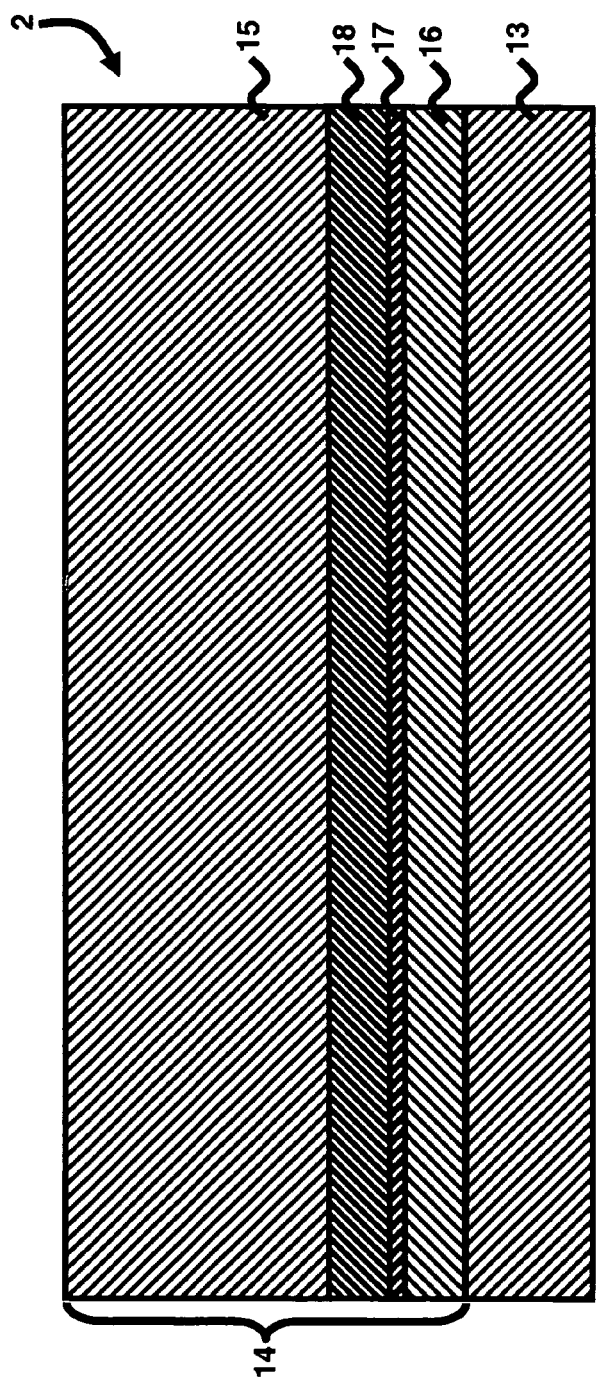
FIG. 3 is a cross-sectional view of a spin valve sensor according to an embodiment of the invention.

The first step in the fabrication process of the MEMS device 1 is the deposition of the spin valves 2 on the SOI wafer 6. For example, spin valves 2, such as those available from NVE Corporation, Minnesota, USA and having a magnetoresistance of approximately 5%, may be used. Spin valves 2 are chosen as the magnetic sensor 2 in the preferred embodiment of the invention because they represent a mature technology with a significant amount of 1/f noise. As shown in FIG. 3, the spin valve 2 is generally configured as a multi-layered structure comprising a plurality of magnetic films 14. The magnetic films 14 are preferably deposited on a $Si_3N_4$-covered wafer 13 by radio frequency (RF) diode sputtering. A magnetic field of approximately 20 Oe is applied during the deposition to induce the magnetic easy axes and pinning direction. The magnetic films 14 comprise an antiferromagnetic layer (preferably comprising CrPtMn) 15 and two thin ferromagnetic layers 16, 18 separated by a thin conducting layer (preferably comprising Cu) 17. The rotation of the magnetization of one of the ferromagnetic layers (preferably comprising CoFe) 18, the pinned layer, is hindered by exchange interactions at the interface with the antiferromagnetic layer 15. The magnetization of the other ferromagnetic layer; i.e., free layer (preferably comprising NiFeCo/Ta/NiFeCo) 16 rotates in response to an applied field. The resistance of the magnetic films 14 has its minimum value when the magnetizations of the two ferromagnetic layers 16, 18 are parallel.

the formation of a stripe-like magnetic domain configuration and to achieve high magnetic permeability. The height of the flux concentrator 3 is approximately 104 µm. The short side of the trapezoid configuration of the flux concentrator 3 is approximately 83 µm long and the longer, back side of the trapezoid configuration of the flux concentrator is approximately 150 µm long.

The size of the flux concentrators 3 is limited by the need to keep the resonant frequency of the flux concentrators 3, comb drives 4, and springs 5 in the range of several kHz or higher. The values for the enhancement provided by the flux concentrators 3 are calculated when the separation between the MEMS flaps 7 is at their planned maximum and minimum displacements. These values are approximately 1.5 and 3.5, respectively.

The mechanical resonant frequencies of seven different MEMS devices 1 are calculated for making mechanical finite element calculations. Table 1 shows the results of these calculations. The two low frequency normal modes for in plane motion are for the two MEMS flaps 7 and are to move in phase with one another or 180 degrees out of phase. The later mode is the desired mode. It is higher in frequency because the spring 5 connecting the two flaps 7 is compressed.

TABLE 1

Mechanical resonant frequencies of MEMS structures:

|  | MEMS device #1 | MEMS device #2 | MEMS device #3 | MEMS device #4 | MEMS device #5 | MEMS device #6 | MEMS device #7 |
| --- | --- | --- | --- | --- | --- | --- | --- |
| Freq. Mode Hz ↑↑ | 21278 | 4623 | 8570 | 6123 | 7885 | 5727 | 8560 |
| Freq. Mode Hz ↑↓ | 38647 | 8198 | 14871 | 10292 | 12011 | 7886 | 9371 |
| Force for 10µ disp. µN | 135.8 | 6.0 | 19.3 | 19.3 | 12.5 | 5.14 | 7.73 |

Following the deposition of magnetic films 14, the unpatterned sensor wafer 13 is annealed in forming gas at approximately 200° C. for approximately 2 hours. Following the patterning of the device stripes, the sensor wafer 13 undergoes a final sequence of annealing steps (temperature up to approximately 265° C.) to establish the magnetization of the pinned layer 18 across the stripe, and the magnetization of the free layer 16 down the stripe. The magnetic sensors 2 are patterned approximately 3 µm wide and approximately 88 µm long.

Figure 4:
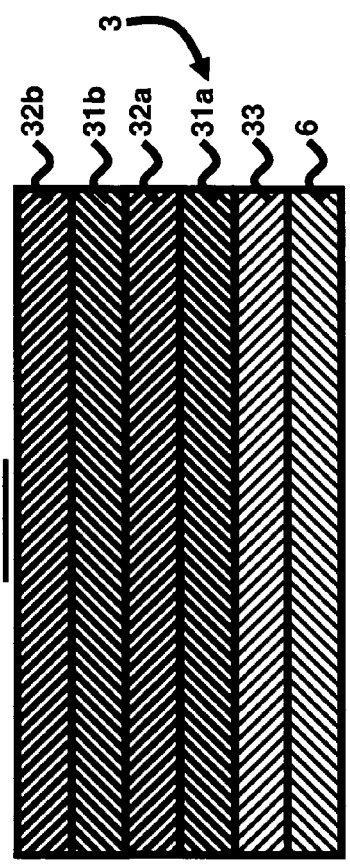
FIG. 4 is a cross-sectional view of a flux concentrator according to an embodiment of the invention.

Preferably, the flux concentrators 3 are trapezoidal in shape and are made by DC magnetron sputtering of two repeats (i.e., double layer) of approximately 40 Å Cr /1,500 Å permalloy films (Cr films 31a, 31b and permalloy films 32a, 32b) deposited on photoresist 33 covered SOI wafers 6 as shown in FIG. 4. The base pressure is approximately $2 \times 10^{-7}$ Torr. No bias voltage or substrate heating is applied during the deposition. Preferably, the Cr 31a, 31b is deposited at approximately 1.5 mTorr with approximately 60 W of DC power. Preferably, the permalloy 32a, 32b is deposited at approximately 1.25 mTorr at approximately 300 W of DC power. The deposition conditions are chosen to maximize domain size and to minimize film stress. The intervening Cr films 31a, 31b serves to break up the magnetic and structural continuity of the permalloy films 32a, 32b and thus suppress In a first embodiment, the flux concentrators 3, comb drives 4, and springs 5 are formed by removing silicon from the device layer 8 using deep reactive ion etching (DRIE). As previously mentioned, the flux concentrators 3, comb drives 4, and springs 5 are released from the underlying SOI wafer 6 by dipping the flux concentrators 3, comb drives 4, and springs 5 in HF acid to remove the underlying $SiO_2$ layer 9. Laser dicing may be used to separate different devices during fabrication. However, the HF used in the release step may damage the spin valves 2. Accordingly, three solutions may be used to solve this problem. The preferred solutions are using: (1) Si/epoxy/Si wafers 26—in this case, the release is performed in an oxygen plasma that will not affect the spin valves 2; (2) Flip-chip bonding—the flux concentrators 3, comb drives 4, and springs 5 and the spin valves 2 are fabricated on separate wafers 6, 13, respectively and the spin valves 2 are not exposed to HF; and (3) using protective layers such as bilayers of silicon nitride and gold (not shown) that will prevent the HF from damaging the spin valves 2.

FIGS. 5(A) and 5(B) illustrate the resistance of spin valves 2 with and without flux concentrators 3. The amount that the flux concentrators 3 enhance the field is compared with calculated values in Table 2, which indicates that the agreement is good.

TABLE 2

Properties of the spin valves and the enhancements provided by flux concentrators:

| | Avg. Linear Region Slope (mV/Oe)* | Measured Enhancement | Calculated Enhancement |
|---|---|---|---|
| No Flux Concentrator | 0.21133 | — | — |
| Small Flux Concentrator | 0.41826 | 1.98 | 1.93 |
| Large Flux Concentrator | 0.69586 | 3.29 | 3.36 |

*Voltage across the spin valve 2 is set to approximately 400 mV in all cases.

Figure 6:
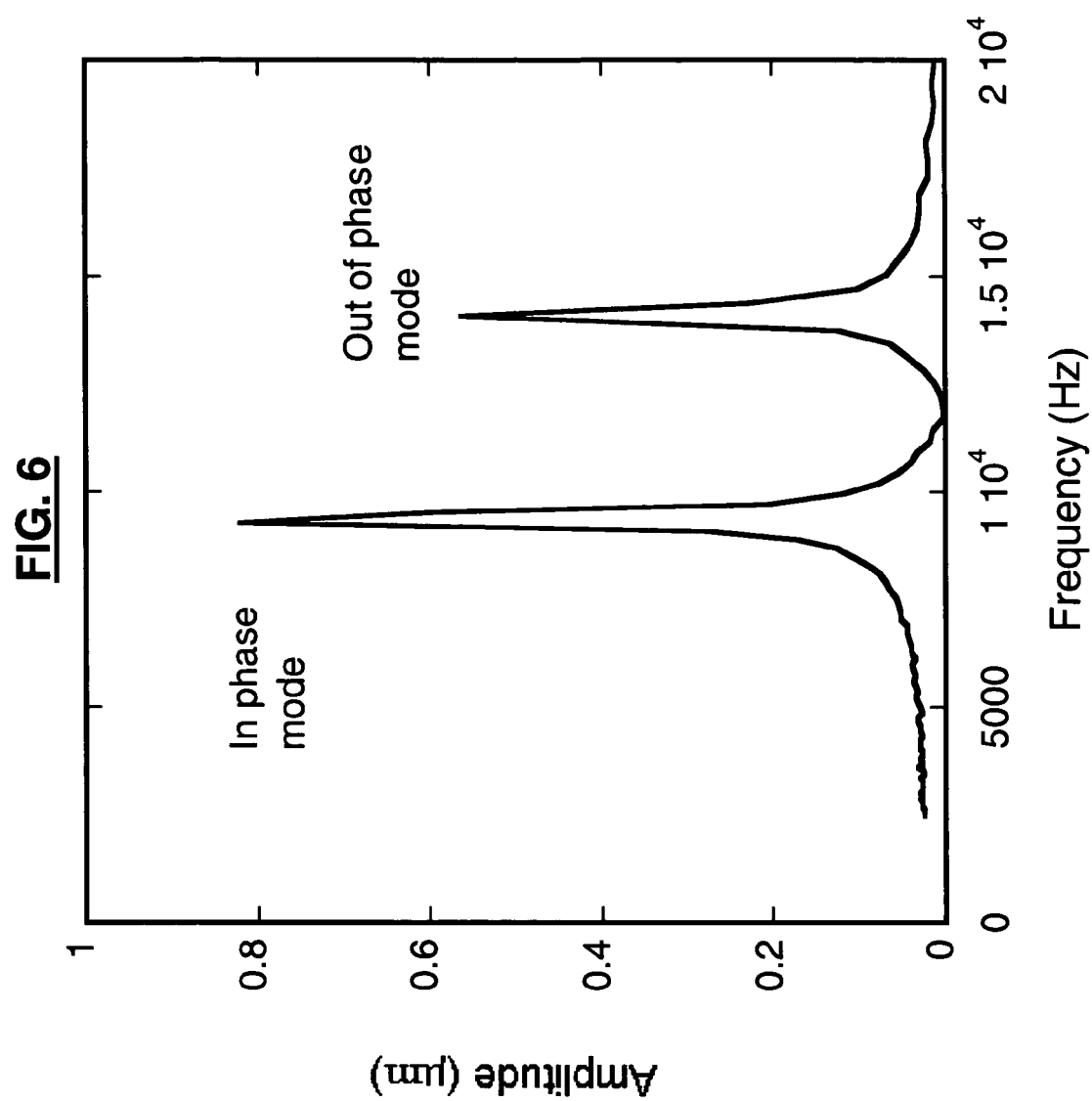
FIG. 6 is a graphical representation illustrating the amplitude of the motion of a MEMS structure showing the two low frequency normal modes according to an embodiment of the invention.

FIG. 6 shows the amplitude of the motion of flux concentrators 3, comb drives 4, and springs 5 versus the frequency. The in phase mode and out of phase mode are shown. The Q of the out of phase mode that will be used to modulate the field is approximately 30. Based on this value for Q, it can be estimated that it will only require microwatts of energy to drive the required motion of the flux concentrators 3, comb drives 4, and springs 5. The zero field resistance of the MEMS device 1 is approximately 392 ohms.

The largest magnetoresistance change is only approximately 5%. To observe a field change of approximately 1 nT at low fields, one would have to detect a voltage change of approximately $5 \times 10^9$ V in a voltage of background of approximately 0.82 volts. This illustrates the problem of the large DC bias previously mentioned. Accordingly, the MEMS flux concentrators 3 modulates the field to be sensed. Thus, this eliminates the problem of the DC bias. Moreover, magnetic sensor systems having a single sensor element per field direction may be utilized according to the embodiments of the invention.

The solution to the problem of minimizing 1/f noise in magnetic sensors 2 and the development of the MEMS flux concentrators 3 for minimizing the effect of 1/f noise in magnetic sensors is provided according to the embodiments of the invention. A very difficult task of fabricating the MEMS device 1 is provided according to the embodiments of the invention by combining two very different technologies, MEMS fabrication technology and magnetic sensor technology. The resulting MEMS device 1 may increase the sensitivity of small, low cost, magnetic sensors 2 by one to three orders of magnitude. The MEMS device 1 can be fabricated on wafers 6, 26 by low cost, mass production techniques. Moreover, powering the motion of the MEMS flaps 7 only requires microwatts of energy. Additionally, noise spectrum data, as presented above, provides strong evidence that the MEMS device 1 concept works correctly.

Figure 7:
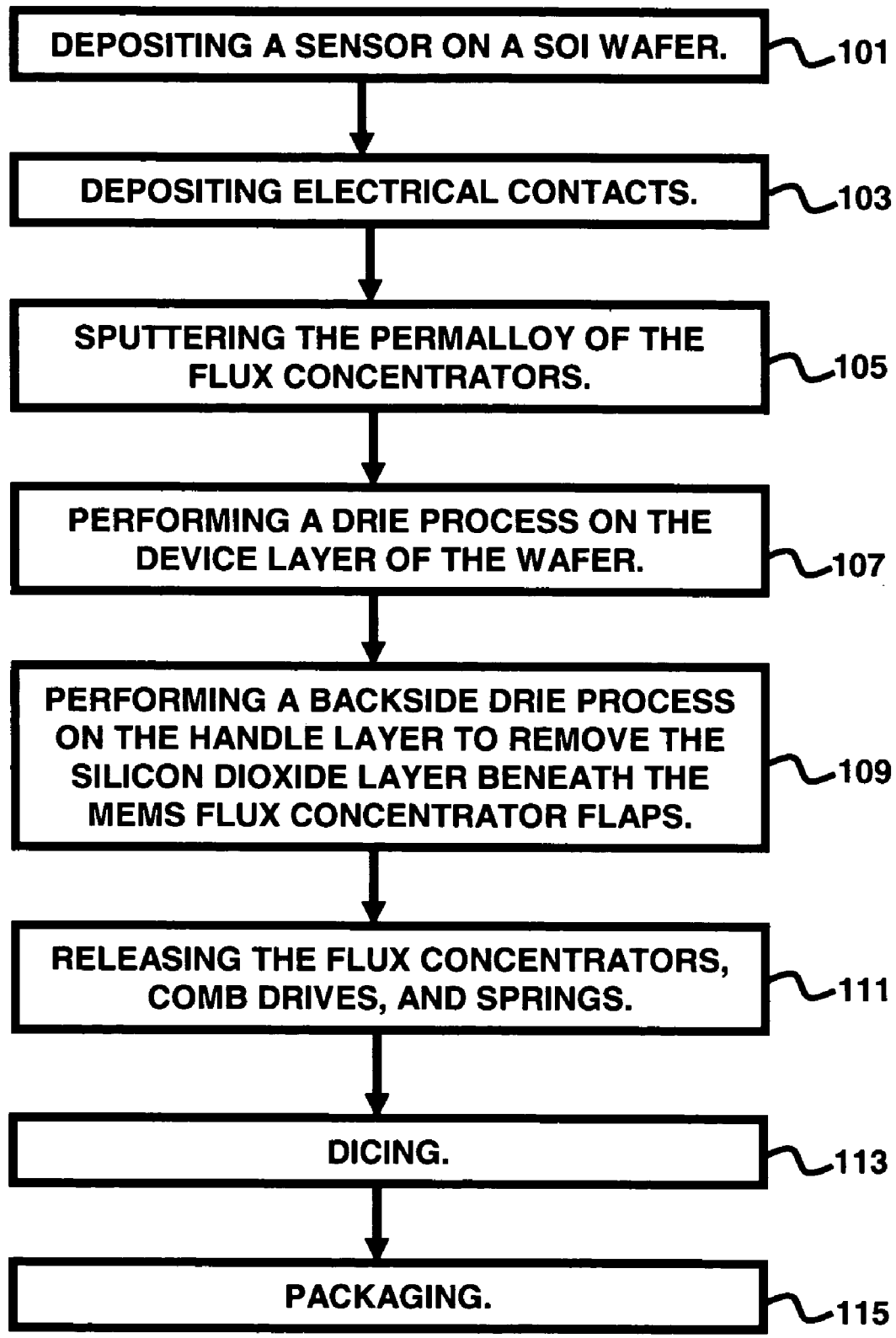
FIG. 7 is a flow diagram illustrating a method of an embodiment of the invention.

FIG. 7 (with reference to FIGS. 1(A) through 6) illustrates a flow diagram of fabricating a MEMS device 1 according to an embodiment of the invention. First, a sensor 2 is deposited (101) on a SOI wafer 6. Then, electrical contacts (not shown), which may comprise gold, are deposited (103). The next step involves sputtering (105) the permalloy 32a, 32b of the flux concentrators 3. Next, a DRIE process is performed (107) on the device layer 8 of the wafer 6 to define the flux concentrators 3, comb drives 4, and springs 5. Thereafter, a backside DRIE process is performed (109) on the handle layer 10 to remove the silicon dioxide layer 9 beneath the MEMS flux concentrator flaps 7. After this, the flux concentrators 3, comb drives 4, and springs 5 are released (111). Finally, dicing (113) and packaging (115) processes are performed to complete the fabrication process.

Figure 8:
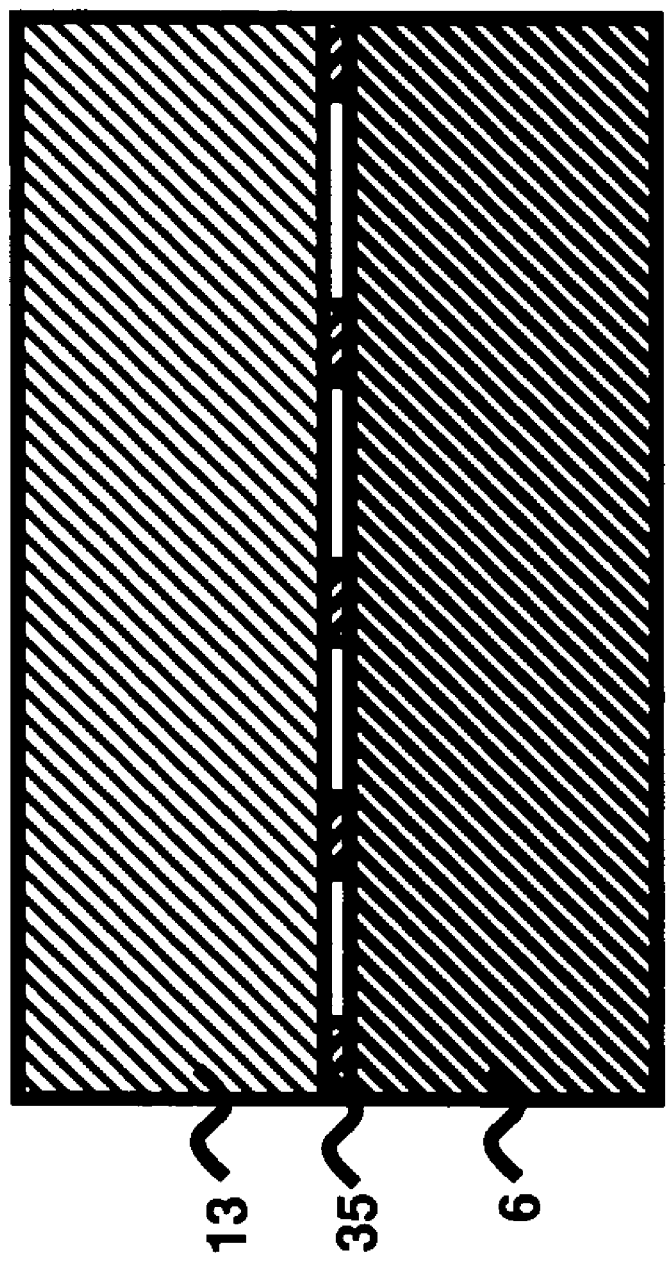
FIG. 8 is a cross-sectional view of a MEMS structure fabricated by flip-chip bonding according to an embodiment of the invention.

An alternative fabrication process is to use flip chip bonding. In this approach, the flux concentrators 3, comb drives 4, and springs 5 are fabricated on a SOI wafer 6 by standard MEMS processing. The magnetic sensor 2 is deposited on a wafer 13. As shown in FIG. 8, Indium (In) bumps 35 can be deposited on the wafer 13. Preferably, the indium bumps 35 are each approximately 2 to 8 microns thick. The SOI wafer 6 and the wafer 13 can be brought together and bonded by applying only pressure and no heating (i.e., non-thermal means only). The bonding pressure is approximately 0.5 gm/In bump and the area of the indium bumps 35 are approximately on the order of 20 sq. microns. This avoids possible damage to the magnetic sensor 2 by heating. The bonding is performed by compressing the indium bumps 35 between gold electrodes (not shown). The lateral alignment may be off by approximately five microns. However, this amount of misalignment does not affect the operation of the MEMS device 1.

As mentioned, the advantage of some magnetic sensors having a large response is greatly decreased because of 1/f noise. According to the embodiments of the invention, the MEMS flux concentrators 3 mitigate the effect of 1/f noise. The flux concentrators 3 achieve this by being positioned on the MEMS flaps 7 that oscillate at kHz frequencies. By shifting the operating frequency, the 1/f noise is reduced by one to three orders of magnitude depending upon the magnetic sensor 2 and the desired operating frequency. In fact, only microwatts are required to drive the motion.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method of fabricating a microelectromechanical system (MEMS) device, said method comprising:
    forming a magnetic sensor over a silicon on insulator (SOI) wafer, wherein said SOI wafer comprises an epoxy layer;
    forming a pair of MEMS flux concentrators sandwiching said magnetic sensor;
    connecting an electrostatic comb drive to each of the MEMS flux concentrators;
    connecting at least one spring to said pair of MEMS flux concentrators and said electrostatic comb drive;
    performing a plurality of deep reactive ion etching (DRIE) processes on said SOI wafer; and
    releasing said MEMS flux concentrators, said electrostatic comb drive, and said at least one spring from said SOI wafer.

2. The method of claim 1, wherein said magnetic sensor is formed by:
    providing an antiferromagnetic layer;
    positioning a first ferromagnetic layer over said antiferromagnetic layer;
    positioning a conducting layer over said first ferromagnetic layer; and
    positioning a second ferromagnetic layer over said conducting layer.

3. The method of claim 1, wherein said plurality of DRIE processes comprise performing a DRIE process on said SOI wafer to define said MEMS flux concentrators, said electrostatic comb drives, and said at least one spring.

4. The method of claim 1, wherein said MEMS flux concentrators comprise a layer of silicon dioxide thereunder, and wherein said plurality of DRIE processes comprise performing a DRIE process on a handle layer of said SOI wafer to remove said layer of silicon dioxide from beneath said MEMS flux concentrator.

5. The method of claim 1, wherein the releasing of said MEMS flux concentrators, said electrostatic comb drive, and said at least one spring from said SOI wafer is performed using oxygen plasma.

6. The method of claim 1, wherein said MEMS flux concentrators comprise a double layer of Cr and permalloy.

7. A method of fabricating a microelectromechanical system (MEMS) device, said method comprising:
    forming a magnetic sensor over a silicon on insulator (SOI) wafer, wherein said SOI wafer comprises a device layer over an intermediate layer over a handle layer;
    forming a pair of MEMS flux concentrators sandwiching said magnetic sensor;
    connecting an electrostatic comb drive to each of the MEMS flux concentrators;
    connecting at least one spring to said pair of MEMS flux concentrators and said electrostatic comb drive;
    performing a plurality of deep reactive ion etching (DRIE) processes on said SOI wafer; and
    releasing said MEMS flux concentrators, said electrostatic comb drive, and said at least one spring from said SOI wafer.

8. The method of claim 7, wherein said magnetic sensor is formed by:
    providing an antiferromagnetic layer;
    positioning a first ferromagnetic layer over said antiferromagnetic layer;
    positioning a conducting layer over said first ferromagnetic layer; and
    positioning a second ferromagnetic layer over said conducting layer.

9. The method of claim 7, wherein said plurality of DRIE processes comprise performing a DRIE process on said device layer of said SOI wafer to define said MEMS flux concentrators, said electrostatic comb drives, and said at least one spring.

10. The method of claim 7, wherein said MEMS flux concentrators comprise a layer of silicon dioxide thereunder, and wherein said plurality of DRIE processes comprise performing a DRIE process on said handle layer of said SOI wafer to remove said layer of silicon dioxide from beneath said MEMS flux concentrator.

11. The method of claim 7, wherein the releasing of said MEMS flux concentrators, said electrostatic comb drive, and said at least one spring from said SOI wafer is performed using oxygen plasma.

12. The method of claim 7, wherein said intermediate layer comprises an epoxy layer.

13. The method of claim 7, wherein said MEMS flux concentrators comprise a double layer of Cr and permalloy.

14. A method of fabricating a microelectromechanical system (MEMS) device, said method comprising:
    forming a first wafer;
    forming adhesive bumps on said first wafer;
    forming a magnetic sensor on said first wafer;
    forming a second wafer;
    forming a pair of MEMS flux concentrators, a pair of electrostatic comb drives, and at least one spring on said second wafer, wherein said pair of MEMS flux concentrators, said pair of electrostatic comb drives, and said at least one spring is connected to one another, and wherein said pair of MEMS flux concentrators sandwich said magnetic sensor;
    bonding said second wafer to said adhesive bumps; and
    compressing said adhesive bumps using non-thermal means.

15. The method of claim 14, wherein said adhesive bumps comprise indium.

16. The method of claim 14, wherein said non-thermal means comprises pressure.

17. The method of claim 14, wherein said magnetic sensor is formed by:
    providing an antiferromagnetic layer;
    positioning a first ferromagnetic layer over said antiferromagnetic layer;
    positioning a conducting layer over said first ferromagnetic layer; and
    positioning a second ferromagnetic layer over said conducting layer.

18. The method of claim 14, wherein said first wafer comprises a silicon on insulator (SOI) wafer.

19. The method of claim 14, wherein said second wafer comprises $Si_3N_4$.

20. The method of claim 14, wherein said MEMS flux concentrators comprise a double layer of Cr and permalloy.

21. A method of fabricating a microelectromechanical system (MEMS) device, said method comprising:
    forming a magnetic sensor over a silicon on insulator (SOI) wafer, wherein said SOI wafer comprises an epoxy layer;
    forming a MEMS flux concentrator proximate said magnetic sensor;
    connecting an electrostatic comb drive to the MEMS flux concentrator;
    connecting at least one spring to said MEMS flux concentrator and said electrostatic comb drive;
    performing a plurality of deep reactive ion etching (DRIE) processes on said SOI wafer; and
releasing said MEMS flux concentrator, said electrostatic comb drive, and said at least one spring from said SOI wafer.

22. The method of claim 21, wherein said magnetic sensor is formed by:
    providing an antiferromagnetic layer;
    positioning a first ferromagnetic layer over said antiferromagnetic layer;
    positioning a conducting layer over said first ferromagnetic layer; and
    positioning a second ferromagnetic layer over said conducting layer.

23. The method of claim 21, wherein said plurality of DRIE processes comprise performing a DRIE process on said SOI wafer to define said MEMS flux concentrator, said electrostatic comb drive, and said at least one spring.

24. The method of claim 21, wherein said MEMS flux concentrators comprise a layer of silicon dioxide thereunder, and wherein said plurality of DRIE processes comprise performing a DRIE process on a handle layer of said SOI wafer to remove said layer of silicon dioxide from beneath said MEMS flux concentrator.

25. The method of claim 21, wherein the releasing of said MEMS flux concentrator, said electrostatic comb drive, and said at least one spring from said SOI wafer is performed using oxygen plasma.

* * * * *